United States Patent
Le Vaillant et al.

(10) Patent No.: US 7,176,554 B2
(45) Date of Patent: Feb. 13, 2007

(54) METHODS FOR PRODUCING A SEMICONDUCTOR ENTITY

(75) Inventors: Yves Matthieu Le Vaillant, Crolles Cedex (FR); Olivier Rayssac, Grenoble (FR); Christophe Fernandez, Grenoble (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 188 days.

(21) Appl. No.: 10/863,193

(22) Filed: Jun. 7, 2004

(65) Prior Publication Data

US 2005/0191779 A1 Sep. 1, 2005

(30) Foreign Application Priority Data

Mar. 1, 2004 (FR) ................... 04 02080

(51) Int. Cl.
*H01L 23/544* (2006.01)
*H01L 29/06* (2006.01)
*H01L 21/768* (2006.01)
*H01L 21/78* (2006.01)
*H01L 21/46* (2006.01)
*H01L 21/30* (2006.01)

(52) U.S. Cl. ............ 257/620; 257/618; 257/E21.596; 257/E21.59; 438/458; 438/459; 438/977

(58) Field of Classification Search ........ 257/618–620, 257/E21.596, E21.599; 438/455, 458–459, 438/960, 977
See application file for complete search history.

(56) References Cited

U.S. PATENT DOCUMENTS

| | | | |
|---|---|---|---|
| 5,559,043 A | 9/1996 | Bruel | 437/24 |
| 6,100,166 A | 8/2000 | Sakaguchi et al. | 438/455 |
| 6,887,650 B2 * | 5/2005 | Shimoda et al. | 430/311 |
| 6,936,482 B2 * | 8/2005 | Auberton-Herve | 438/14 |

(Continued)

FOREIGN PATENT DOCUMENTS

DE 197 30 975 A1 1/1999

(Continued)

OTHER PUBLICATIONS

G. K. Celler et al., "Frontiers Of Silicon-On-Insulator", Journal of Applied Physics, vol. 93, No. 9, pp. 4955-4978 (2003).

(Continued)

*Primary Examiner*—Luan Thai
(74) *Attorney, Agent, or Firm*—Winston & Strawn LLP (57) ABSTRACT

A method for producing a semiconductor entity is described. The method includes providing a donor substrate having a zone of weakness at a predetermined depth to define a thin layer, and the donor substrate includes a bonding interface. A receiver substrate is also provided that includes at least one motif on its surface. The technique further includes bonding the donor substrate at the bonding interface to the at least one motif on the receiver substrate, and supplying sufficient energy to detach a portion of the thin layer from the donor substrate located at the at least one motif and to rupture bonds within the thin layer. The energy thus supplied is insufficient to rupture the bond at the bonding interface. Also described is fabrication of a wafer and the use of the method to produce chips suitable for use in electronics, optics, or optoelectronics applications.

19 Claims, 4 Drawing Sheets

U.S. PATENT DOCUMENTS

| | | | |
|---|---|---|---|
| 2002/0096717 A1 | 7/2002 | Chu et al. | 257/347 |
| 2003/0017712 A1* | 1/2003 | Brendel | 438/758 |
| 2003/0077885 A1 | 4/2003 | Aspar et al. | 438/517 |
| 2004/0110320 A1 | 6/2004 | Aspar et al. | 438/110 |
| 2005/0048736 A1* | 3/2005 | Kerdiles et al. | 438/455 |

FOREIGN PATENT DOCUMENTS

| | | |
|---|---|---|
| EP | 1 213 748 A2 | 6/2002 |
| FR | 2 809 867 | 12/2001 |
| FR | 2 823 599 | 10/2002 |
| WO | WO 02/071475 | 9/2002 |
| WO | WO 02/071475 A1 | 9/2002 |
| WO | WO 02/084722 | 10/2002 |
| WO | WO 03/081664 | 10/2003 |

OTHER PUBLICATIONS

Nakamura, S. et al., May 1998, "InGaN/GaN/AlGaN-Based LEDs and Laser Diodes", MRS Internet J. Nitride Semicond. Res. 4S1, G1.1 (1999).

Q.Y. Tong et al., Semiconductor Wafer Bonding: Science and Technology, Interscience Technology, a Wiley Interscience Publication, John Wiley & Sons, Inc. (1999).

O. Rayssac et al., "Influence Of Surface Characteristics On Direct Wafer Bonding", Proceedings of the 2nd International Conference on Materials for Microelectronics, IOM Communication pp. 183, (1998).

* cited by examiner

METHODS FOR PRODUCING A SEMICONDUCTOR ENTITY

BACKGROUND ART

The present invention generally relates to producing at least one semiconductor entity on a substrate, wherein the semiconductor entity may have a generally rectangular or a cylindrical geometric shape.

Typically, "on-substrate" entities are formed, and sometimes treated, for inclusion at least partially in chips intended for electronics applications. Such applications include, for example, components for micro-electro-mechanical systems (MEMS), components for optics, or for optoelectronics such as light emitting diodes (LEDs) or laser diodes (LDs), or for optical receivers. The entities or chips are normally produced on a substrate in hundreds or thousands of units, normally arranged in a regular matrix.

After the chips are produced, they then have to be individualized or customized and then transferred to substrates termed "receivers". The chip customization operation is often difficult to complete because it must be conducted in a particularly accurate and clean manner, in particular when the chips are intended for use in certain applications such as laser applications.

Semiconductor lasers emit light via mirrors, wherein the mirrors are positioned in the transverse facets of the chips wherein customization operations have taken place. Thus, chip customization must be carefully conducted to ensure good quality facets, so that flatness of the facets is maintained. There are several known chip customization techniques.

Figure 1:
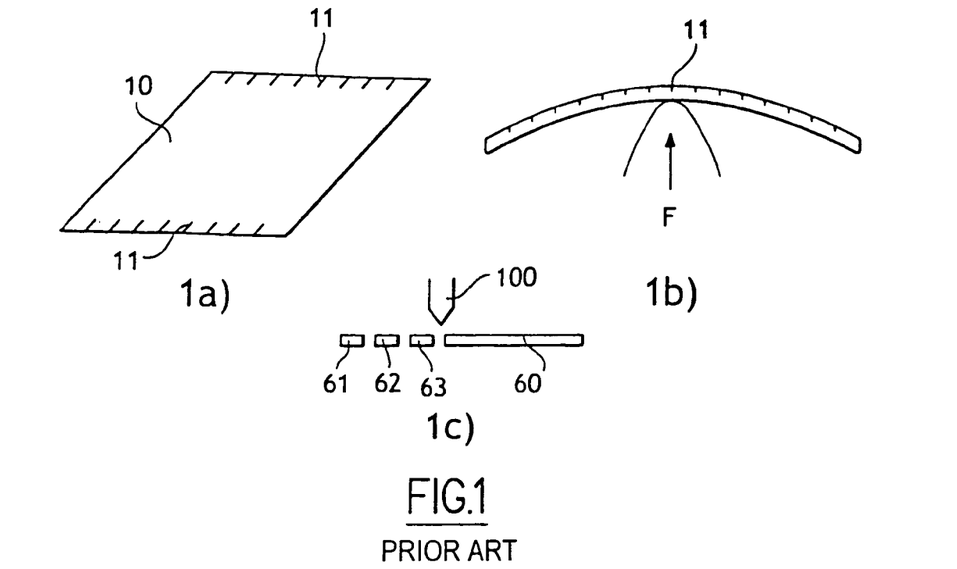
FIG. 1 shows a first prior art method of producing a semiconductor entity on a substrate.

FIG. 1 shows a first known customization technique which utilizes a mechanical separation or cleavage process between the chips. In particular, FIG. 1a shows a series of cleavage starters such as a starter nick 11, produced in the appropriate crystallographic directions on the front face of the chips (not shown) using a tool with a hard point (such as a diamond tip). FIG. 1b shows a mechanical stress F exerted on the rear face of a substrate 10 at the starter nick 11 and in the direction of an appropriate crystallographic plane. This mechanical stress cleaves the substrate 10 along the starter nick 11 to create a plurality of strips each comprising a plurality of chips. FIG. 1c shows a diamond tip being used to split each strip 60 into a plurality of dies 61, 62, and 63, wherein each die includes at least one chip, thus customizing the chips. However, this first technique has a fairly low yield for large numbers of chips. Further, use of the first technique runs the risk of creating mechanical defects in the chips when applying the mechanical stress operation.

Figure 2:
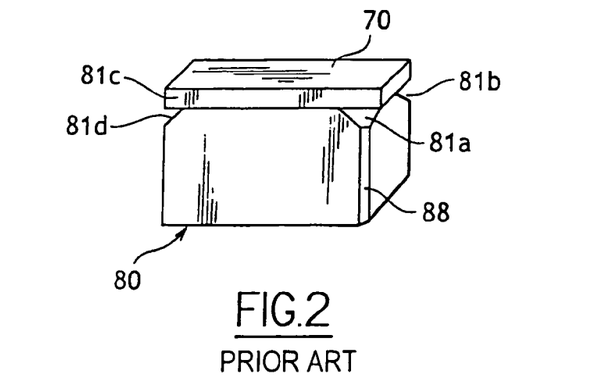
FIG. 2 shows a second prior art method of producing a semiconductor entity on a substrate.

FIG. 2 illustrates a second known customization technique that utilizes chemical treatments between the chips. A mask 70 covers each chip 80 and protects that chip 80 from chemical attack, for example, from a simple dry etching process or from electromagnetic exposure during photolithography. The surrounding substrate is thus etched to form grooves between the chips. Final cutting is then carried out by conventional means to separate the dies.

The second technique described above appears to be more suitable than the first technique for fabricating large numbers of chips because it provides the possibility of simultaneously customizing all of the chips over the entire substrate surface. However, despite the protection conferred by the mask 70, the second technique does not protect from under etching at positions 81a, 81b, 81c, 81d, wherein a chemical attack takes place into the chip 80 beneath the mask 70. The second technique also causes unwanted etching 88 at the corners of the chip 80. This results in a reduced quality chip 80, in particular with regard to the flatness of its facets.

Figure 3:
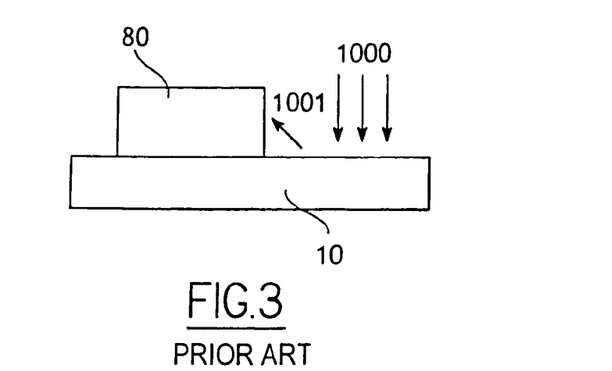
FIG. 3 shows a third prior art method of producing a semiconductor entity on a substrate.

A third prior art customization technique is shown in FIG. 3. It comprises using reactive ion etching (RIE), which consists of etching the substrate 10 between the chips 80 in an isotropic manner. The substrate surface 10 is bombarded with natural ions 1000 having an energy suitable to etch the substrate 10 to thus customize the chips 80. However, this third technique often is expensive and difficult to conduct. Further, ion back-scattering 1001 can occur and these ions may etch the facets of the chip 80 resulting in a degraded, less planar chip.

SUMMARY OF THE INVENTION

Presented are methods for producing a semiconductor entity. In an implementation, the method includes providing a donor substrate having a zone of weakness at a predetermined depth to define a thin layer, wherein the donor substrate includes a bonding interface. A receiver substrate is also provided that includes at least one motif on its surface. The method also includes bonding the donor substrate at the bonding interface to the at least one motif on the receiver substrate, and supplying sufficient energy to detach a portion of the thin layer from the donor substrate located at the at least one motif and to rupture bonds within the thin layer. The supplied energy is insufficient to rupture the bond at the bonding interface.

In an advantageous embodiment, the bonds that rupture within the thin layer are aligned along at least one slip plane. The energy may beneficially be supplied locally, for example, supplied at the zone of weakness. In this manner, the bond between the at least one motif and the donor substrate can be preserved. In addition, it is advantageous for the bonding forces at the zone of weakness to be substantially lower than adhesion forces between the at least one motif and the receiver substrate.

In another variant, energy may be supplied substantially homogeneously over the entire structure that includes the donor substrate and the receiver substrate. Further, it is advantageous to weaken the zone of weakness within the donor substrate before supplying energy. This weakening step could include implanting atomic species into the donor substrate at a depth close to the depth of the zone of weakness and applying a heat treatment.

In another advantageous embodiment, the donor substrate may be provided by forming a porous layer on a support wafer and epitaxially growing an upper thin layer on the porous layer, wherein the porous layer forms the zone of weakness. Alternately, the donor substrate may be provided by roughening at least one bonding surface of two wafers, bonding the two wafers together at the roughened bonding surface, and reducing one of the two wafers to form an upper thin layer that is bonded to the other wafer at the roughened bonding surface, wherein the roughened bonding surface forms the zone of weakness.

The method may advantageously include, prior to supplying energy, forming a topographical profile of a plurality of motifs on the surface of a receiver substrate. A mask and etching technique could then be used to etch a desired pattern of motifs into the receiver substrate.

In another beneficial implementation of the technique, after supplying energy, the resulting semiconductor entity is customized, for example, by making an optical connection between at least two entities. The semiconductor entity and/or the at least one motif may be made of a Group III–V alloy.

Another aspect according to the invention pertains to a wafer. The wafer includes a first substrate including at least one projecting motif, and a second substrate bonded to the at least one projecting motif. The second substrate further includes a zone of weakness that defines a thin layer.

In a variant, the first substrate includes a plurality of projecting motifs, and the thin layer is detachable in the locations of the motifs to form chips on the motifs suitable for use in electronics, optics, or optoelectronics applications. If certain parameters are carefully chosen to produce chips of high quality, such chips would be suitable for use as semiconductor lasers or optical receivers.

The methods and apparatus according to the invention could be used, in particular, to produce chips for use as light emitting diodes (LEDs) or laser diodes (LDs).

BRIEF DESCRIPTION OF THE DRAWINGS

Other aspects, purposes and advantages of the invention will become clear after reading the following detailed description with reference to the attached drawings, in which:

FIGS. 5a to 5d are a series of simplified block diagrams illustrating the steps of a second technique for producing a zone of weakness in a donor substrate, wherein FIG. 5b shows an alternative step that can replace the successive steps shown in FIGS. 5c and 5d, respectively.

DETAILED DESCRIPTION OF THE PREFERRED EMBODIMENTS

In the description that follows, the term "semiconductor entity" means a structure that includes a receiver substrate with at least one motif and a semiconductor die or chip bonded to the motif. The term "motif" relates to at least one feature, such as a rectangular-shaped projection having a substantially flat surface, associated with the receiver substrate. For example, as explained below, a plurality of motifs having recurring features may be formed to project from the surface of the receiver substrate, and the shape may conform to a desired shape of a semiconductor chip.

The invention provides methods for providing a customized semiconductor entity, such as a chip or an array of entities on a donor substrate that could be used in the field of electronics, or optics, or optoelectronics. At least one entity is removed from the donor substrate to transfer it to a receiver substrate. The technique is optimized to produce an entity that has particularly flat facets on the receiver substrate. Further, the method produces an entity with good structural qualities on the receiver substrate. In addition, the entity has facets that are substantially perpendicular to the receiver substrate. In an implementation, a plurality of entities can be transferred to obtain a receiver substrate supporting a selected array of entities. Furthermore, the invention may be used to produce a matrix of entities on the receiver substrate.

A method according to the invention includes forming a zone of weakness in a donor substrate, forming motifs on the surface of a receiver substrate, bonding the receiver substrate to the donor substrate via the motifs, and detaching a portion of the donor substrate that is bonded to the receiver substrate near the zone of weakness.

FIGS. 4 and 5a to 5d show techniques for forming a zone of weakness 15 in a donor substrate 10. A zone of weakness 15 is a zone which contains weak bonds in between an overlying portion and an underlying portion. These weak bonds in the donor substrate 10 are susceptible to being ruptured when energy is supplied, for example, when mechanical energy is used.

Figure 4:
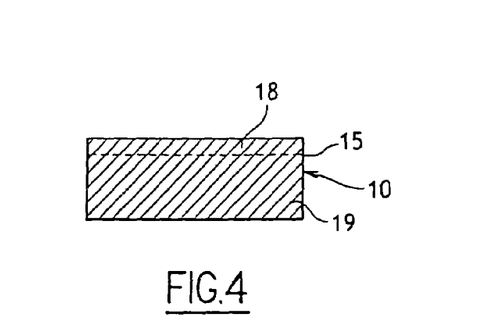
FIG. 4 is a simplified block diagram illustrating a first technique for producing a zone of weakness in a donor substrate.

FIG. 4 shows a donor substrate 10 that includes the zone of weakness 15, wherein the overlying portion of the donor substrate 10 is a layer denoted 18, and the underlying portion below the zone of weakness 15 is denoted 19. The zone of weakness 15 is formed so that the layer 18 is a thin layer having a thickness which lies in the range of several nanometers (nm) to one micrometer (µm). In particular, such a thin layer can be formed when atomic species are implanted to form the zone of weakness 15, as explained below.

A first technique for forming the zone of weakness comprises implanting atomic species (such as hydrogen and/or helium) followed by a weakening step using a heat treatment. Such a process is described in U.S. published application no. 2003/077885. The amount of weakening that occurs at the zone 15 primarily depends on the thermal budget (defined in terms of pairing a temperature and a duration of application). The thermal budget thus determines the final degree of weakening, or the loss of bonding energy associated with such a weakening step.

According to this first technique, the reduced bonding energy is associated with the thermal energy supplied to the implanted zone 15 and can result in the release of implantation gases that remain trapped there to create under-pressurized locations in the weakened zone 15 which form the basis of the weakening. For example, the zone 15 can be weakened in a controlled manner by implanting hydrogen at 200 kilo electron volts (keV) at a density of $4.5 \times 10^{16}$ ions per square centimeter ($cm^{-2}$) into a silicon wafer, and by subjecting the wafer to a weakening process at about 500° C. for about 12 hours (h).

A second weakening technique includes forming a weak interface by creating at least one porous layer which is described, for example, in European patent U.S. Pat. No. 6,100,166. In this case, the zone of weakness 15 is the porous layer that is formed on the lower portion 19 of the donor substrate 10. Formation of the porous layer is preferably followed by growing a layer 18 on the porous layer 15, for example, by epitaxial growth by using CVD or by using MBE (chemical vapor deposition or molecular beam epitaxy respectively).

FIGS. 5a to 5d show a third weakening technique that can be used to form the zone of weakness 15. This technique includes roughening the surface of a first substrate 41 and optionally roughening a second substrate 42. The first substrate 41 is then bonded to the second substrate 42, and a portion of the second substrate 42 is then detached from the structure. This method is described in International Application No. WO 02/084722. Chemical etching is preferably employed to roughen the surface, in which the chemical budget (defined in terms of the combination of the chemical species, and the duration of exposure, and the temperature) is selected to determine the final weakening produced. The weakening produced is the same as the loss of adhesion energy at the zone of weakness 15. The loss of bonding (or adhesion) energy at the zone of weakness 15 is caused by the rough surface, which reduces the contact bonds between the first substrate 41 and the second substrate 42. Altering the roughness value means that the bonding (or adhesion) energy between the two bonded substrates 41 and 42 can be controlled.

Figure 5A:
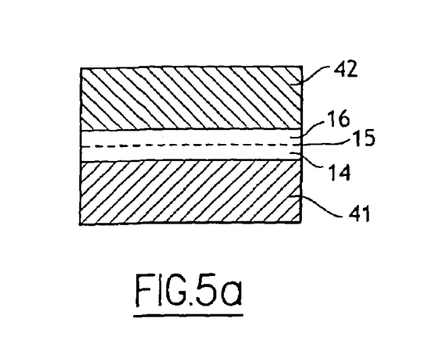

Optionally, a first bonding layer 14 and a second bonding layer 16 are formed on the surface of the first substrate 41 and on the surface of the second substrate 42, respectively. A bonding layer can, for example, be made of $SiO_2$, which could be formed by depositing atomic species of $SiO_2$ or, if the surface is made of silicon, by thermal oxidation. A bonding layer can, for example, be made of $Si_3N_4$ that is formed by depositing atomic species of $Si_3N_4$ or by using a thermal nitride technique when the surface to be oxidized is made of silicon. A bonding layer can therefore be made of $SiO_xN_y$. In an example, HF etching at 8000 Å (Angstroms) to 1100 Å of the layer 14 or the layer 16 of $SiO_2$ results in a surface roughness on the order of 0.625 nanometers rms. This results in adhesion energy with the other layer 16 or 14 of $SiO_2$ on the order of 500 mJ/m$^2$ (millijoules per square meter) instead of about 2 J/m$^2$ which normally occurs when bonding two $SiO_2$ layers that have not undergone a roughening process. These results have been taken from an overview entitled "Proceedings of the 2$^{nd}$ International conference on Materials for Microelectronics", IOM communication, 1998, by Olivier Raysac et al. After roughening the surface of a releasable substrate, the first substrate 41 is bonded to the second substrate 42. Bonding can be hydrophilic (possibly aided by conducting a prior washing step).

A fourth weakening step can consist of forming a layer of adhesive 14 or 16 on at least one of the two surfaces to be bonded. Adhesives with a curable or even reversible nature which can be thermally and/or optically controlled would be suitable. Bonding would then advantageously be followed by a suitable thermal and/or optical treatment to reinforce the adhesive bonds and to achieve an adhesion energy with a low predetermined value.

Figure 5B:
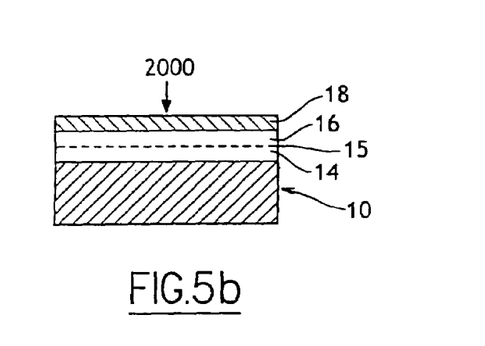
Figure 5C:
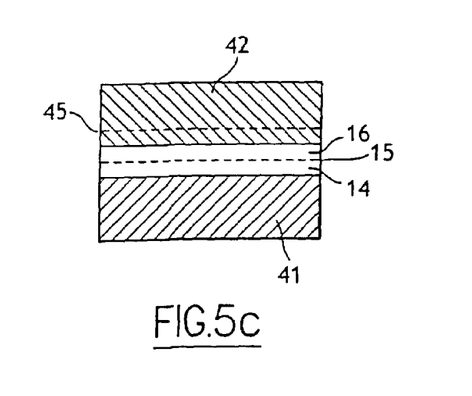
Figure 5D:
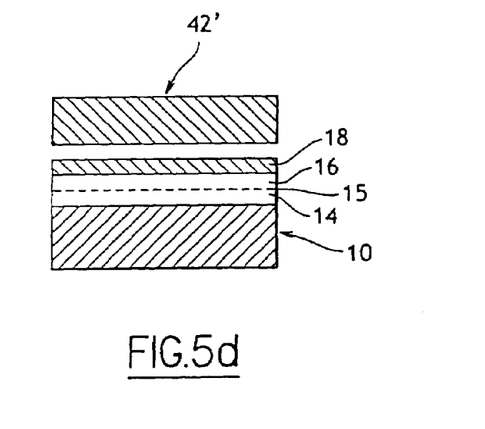

FIG. 5b or FIGS. 5c and 5d illustrate detachment of the second substrate 42 after the bonding step. Referring to FIG. 5b, detachment of the second substrate 42 to preserve just one layer 18 can be conducted by progressively eliminating the substrate 42 by polishing and/or chemical etching it from the back face (generally known as etch-back). Optionally, an etch-stop layer can be provided in the second substrate 42 at or close to the portion 18 of the second substrate 42, and material removal can then be terminated by using selective etching. In the alternate, with reference to FIGS. 5c and 5d, the second substrate 42 can be detached at a pre-weakened zone 45 by supplying thermal and/or mechanical energy. The zone of weakness 45 may be advantageously produced by a controlled implantation of atomic species at that level (for example, by using a SMART-CUT® technique) or by fabricating a porous layer to reside at that level (these techniques were described above with reference to FIG. 4). Preferably, a finishing step is carried out using techniques such as polishing, abrasion, chemical etching, chemical-mechanical polishing (CMP), RTA annealing, atomic species bombardment, sacrificial oxidation or the like. In all cases, the donor substrate 10 includes a zone of weakness 15 after carrying out a weakening technique.

Figure 6:
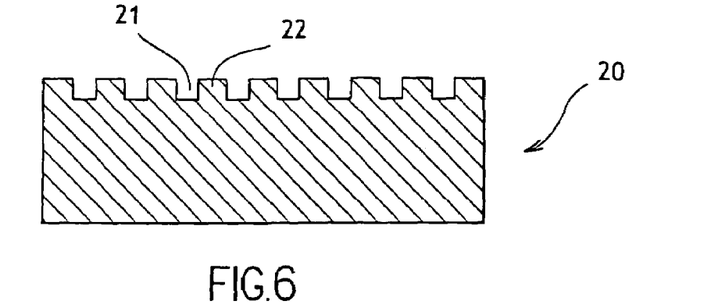
FIG. 6 is a simplified diagram showing a donor substrate in accordance with the invention.

After forming the zone of weakness 15 in the donor substrate 10, motifs are formed on the surface of the receiver which will be bonded to the donor substrate 10. Referring to FIG. 6, one or more motifs in relief have been formed on the surface of the receiver substrate 20. In a first case, a masking layer is provided on the surface of the receiver and the motifs are then formed by depositing crystalline atomic species on the receiver substrate 20. The masking layer blocks the deposition or epitaxy on motif-free zones. As an example, it is possible to use silicon oxide to form the masking layer (to block epitaxy using Group III–V materials). The motifs can be formed in the masking layer by photolithographic techniques. Preferably, the deposition method is crystal growth such as epitaxy by the CVD or the MBE technique.

In a second case, a mask is applied to the surface of the receiver substrate 20 and then the motifs are etched into the thickness of the receiver substrate. The mask has the same topography as that of the desired set of motifs. Advantageously, dry or wet chemical etching is used on the donor substrate 10 and is associated with photolithography steps.

In both cases, when forming the motifs it is advantageous to preserve a thin layer of material between the motifs and the zone of weakness 15 to provide a stiffening effect that is substantially greater than the bonding forces between the zone of weakness 15 of the donor substrate 10.

FIG. 6 shows a plurality of motifs 22 in cross section. A motif 22 in relief is adjacent to a recess 21 in the receiver substrate 20 so that the motif projects from the surface. The motifs shown in FIG. 6 are of substantially rectangular cross section. Advantageously, the side faces of a motif 22 are substantially perpendicular to the main plane of the receiver substrate 20. The motif 22 can have any shape, but the conventional shape of a chip (which will have a geometrical shape that substantially matches that of the motif) is usually rectangular or cylindrical. In addition, the motifs in the same receiver substrate 20 can have different shapes and sizes, and can be regularly aligned or irregularly ordered. Advantageously, the free surface of a motif is flat to facilitate the subsequent bonding to the donor substrate 10 (see FIG. 7). When a plurality of motifs is present on the surface of the receiver substrate 20, it is advantageous for the free surfaces of all of the motifs to lie substantially in the same plane so that the subsequent bonding to the donor substrate 10 (see FIG. 7) is conducted in a uniform manner over all of the motifs. Optionally, the surfaces of the motifs can be finished using one of the techniques mentioned above, for example.

Figure 7:
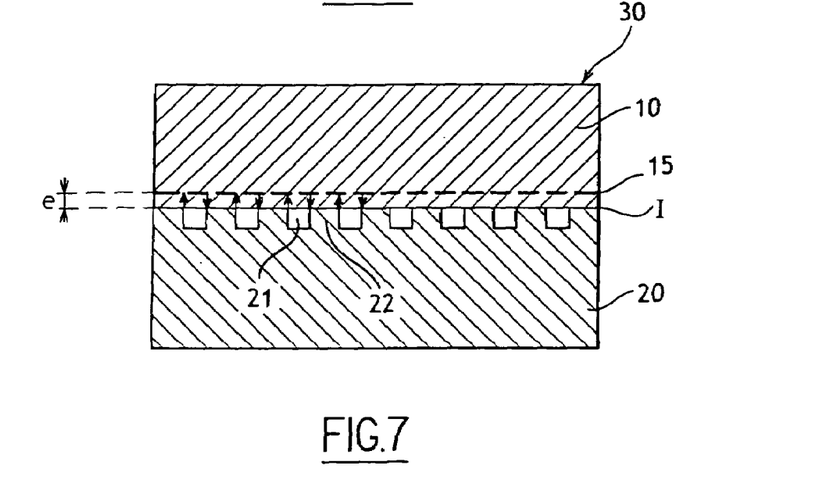
FIG. 7 shows bonding of the donor substrate of FIG. 6 with a receiver substrate according to the invention.

Referring to FIG. 7, the receiver substrate 20 is bonded to the donor substrate 10 at the free surfaces of the motifs to form a wafer 30. Bonding can be hydrophilic. Adhesive layers may be added at the bonding surfaces to assist in the bonding, and such layers may be heat-curing adhesives or adhesives that harden when UV radiation is applied. Oxide layers may also be formed to assist in the bonding. Bonding is advantageously followed by a heat treatment to reinforce the adhesive forces, so that they are substantially greater than the bonding forces in the zone of weakness 15. Several bonding techniques are proposed in the book "Semiconductor wafer bonding science and technology". The wafer 30 includes the assembly of motifs and a portion between the zone of weakness 15 and the bonding interface I. Thus, a layer of material with a mean thickness "e" separates the motifs from the zone of weakness 15.

The difference between the adhesive energies at the bonding interface I and the bonding forces in the zone of weakness 15, as well as the value of the thickness "e", are the primary factors determining the desired conditions for detaching the substrate 10 close to the zone of weakness 15. Consequently, the technique used to form the zone of weakness 15, the method used for forming the motifs, and the bonding techniques used must all be chosen carefully so that the detachment step occurs in accordance with the invention.

Figure 8:
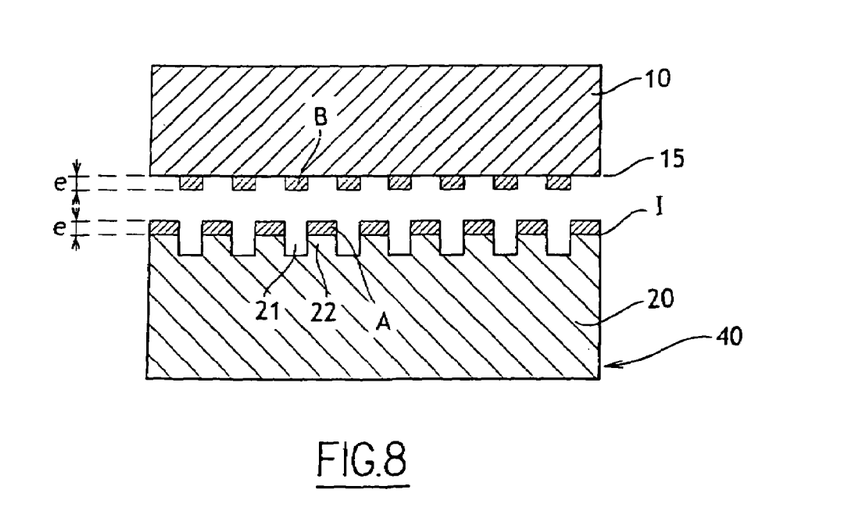
FIG. 8 shows a detaching step of the semiconductor entity according to the invention.

Referring to FIG. 8, energy is supplied to the wafer 30 so that the donor substrate 10 detaches from the receiver substrate 20 close to the zone of weakness 15. Advantageously, the bonding energy at the zone of weakness 15 is substantially lower than the adhesion energy at the interface I. In such a case, detachment occurs more easily along the zone of weakness 15 than along the bonding interface I. Thus, the energy supplied to the wafer 30 can be selected to be in the range greater than the bonding energy of the zone of weakness 15 but less than the adhesion energy of the bonding interface I. This energy can be supplied in a substantially homogeneous manner over the whole volume of the wafer 30, for example, in the form of thermal energy. It is also possible to heat treat the wafer 30 in order to weaken the bonds at the zone of weakness 15 to achieve detachment of a portion of the donor substrate 10.

The energy supplied could also be mechanical. For example, a tensile stress and/or bending stress and/or shear stress could be applied. Alternatively or in combination, the energy can be supplied locally. The energy is preferably supplied locally to the zone of weakness 15, so that it is focused on the zone of weakness 15 (and to the weak bonds it contains) rather than to the bonding interface I. For example, a cutting edge disposed at the zone of weakness 15 can apply a force in a direction substantially parallel to the plane of the zone of weakness 15, to initiate detachment of the wafer 30 at its edge near the zone of weakness 15. In all cases, the supply of energy in accordance with the invention is conducted to encourage detachment of the wafer 30 near the zone of weakness 15. Detachment close to the zone of weakness 15 will then occur at the weakest interface near the zone of weakness 15. Detachment occurs in a profile corresponding to a principle of low bonding energy near the zone of weakness 15.

Two types of weak bonds exist close to the zone of weakness 15. The first includes weak bonds located near the zone of weakness 15, and the second includes zones of weakness associated with the recessed portions (which then form cavities inside the wafer 30) that separate the motifs. For example, at the motif 22 detachment or rupture will tend to occur along the zone of weakness 15. In contrast, at a hollow portion such as the hollow portion 21 (which is an internal cavity 21 in FIG. 7) two weak bond types exist. Consequently, detachment will tend to occur either along the zone of weakness 15, or along the internal cavity 22 by overcoming the stiffening effect of the layer of material of thickness "e".

If the thickness "e" is sufficiently small, which means that the motifs are close to the zone of weakness 15, the stiffening effect of the layer with thickness "e" may fail during detachment with respect to the other forces in play (and in particular with respect to the bonding forces in the zone of weakness 15), and the mechanical detachment force. How the thin layer functions depends on the size and distribution of the motifs and the mechanical properties of the material. As explained earlier, the profile of the mechanical force used in the detachment step advantageously follows the minimum bonding energy, but this force will deviate with respect to the plane of the zone of weakness 15 to go in another direction through the thin layer with thickness "e". Rupture of the thin layer having a thickness "e" is thus local, opening the cavity 21. Once the cavity 21 is open, and to minimize the energy, a second rupture will occur through the thin layer with thickness "e" at the end of the cavity 21, to reach the zone of weakness 15 at which detachment will continue to occur at motif 22.

In a first case, the local ruptures at the layer with thickness "e" conducted over the entire surface of the wafer 30 occurs in a direction that is substantially transverse to the layer with thickness "e" to follow the shortest path from the zone of weakness 15 to the cavity 22. In a second case, the ruptures are separations that occur along the crystallographic planes of lowest energy, for example the <111> Miller plane in a silicon lattice. In a third case, separation can occur both along the shortest paths and along preferred crystallographic planes. In all cases, the separations are clean and result in particularly flat surfaces.

Referring to FIG. 8, a structure 40 is obtained after detachment that includes the receiver substrate 20 and the bonded motifs (including the motif 22), above which are semiconductor entities having thicknesses "e" (including entity "A"). These entities have in fact been removed from the thin layer having thickness "e" by rupture or detachment within the layer with thickness "e" leaving their "negative portions" (such as portion "B") on the lower portion 19 of the donor substrate 10. The nature of the removal, by rupture in the thin layer of thickness "e", has its origin in seeking the lowest bonding energy when supplying external energy. This results in entities having clean, well defined, straight edges. These edges can be inclined with respect to the general plane of the layer with thickness "e" depending on the nature of the rupture (along a crystallographic plane or "shortest path") or due to the shapes of the motifs formed in the receiver substrate 20. More "exotic" shapes for the entities than the square dies shown in the Figures can be produced by changing the inclination of the side facets of the motifs with respect to the plane of the zone of weakness 15, or by changing the crystallographic planes of the layer with thickness "e".

The present invention makes it possible to obtain very good quality entities having the desired geometric characteristics that are closer to perfection than entities produced by using prior art methods. Furthermore, the method according to the invention can transfer all or part of a large quantity of entities in a single detachment step, and thus constitutes a rapid method for producing semiconductor entities on a substrate.

The assembly including a motif 22 and an entity "A" forms a die 80 (see FIG. 9) that may be used for electronic, optical, or optoelectronic applications. The dies can then be reworked to produce the intended chips. The present method enables batches of quality dies 80 on a substrate 20 to be produced rapidly and reliably. The method of the invention also produces very good alignment of the dies 80 on the substrate 20. Since the dies 80 are aligned from the moment of their creation, the production of certain devices necessitating an alignment of dies 80 can be simplified.

Figure 9:
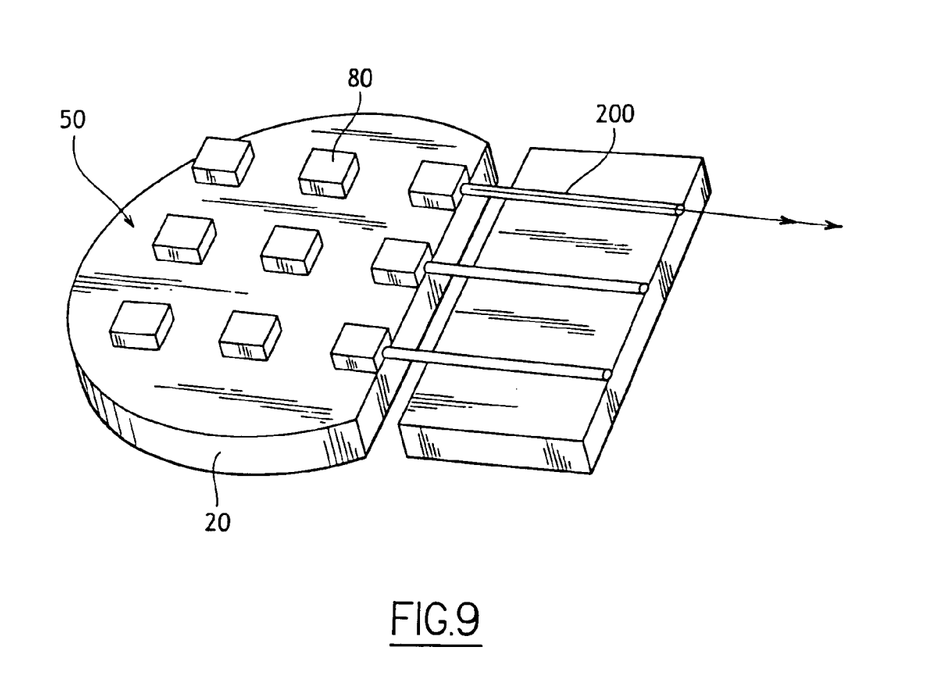
FIG. 9 shows an example of an application of the method according to the invention.

FIG. 9 shows an example of a device fabricated by applying the method of the invention. In particular, the method of the invention is used to obtain a matrix 50 of dies 80 made of Group III–V alloy and intended for optics or optoelectronics. The dies 80 are particularly well aligned with each other and thus form an array that is aligned in rows and columns. Thus, it only remains for the dies 80 to be connected together to form an array of optical fibers 200. Dies 80 can also be individualized or grouped together using conventional means to form individual dies or to form strips or assemblies of dies.

The die 80 or chip 80 obtained individually or in a group can then be soldered to a heat dissipating base, or can be electrically connected to an electrical contact (for example to a metal wire (Al, Au or the like) by thermocompression or ultrasound). The die or chip 80 could also be coupled with an optical fiber in a particularly effective manner (in view of an optimum yield of optical energy at the input and/or output of the chip 80), can be placed in a package and aligned with an optical outlet and/or inlet thereof, can be connected to other chips 80 via profiled metal circuits of greater or lesser complexity, and can be connected in many other various configurations.

A few examples of applications of the method of the invention for type III–V materials are given below. In particular, the examples concern a donor substrate 10 from which dies (or chips) are produced.

EXAMPLE 1

The donor substrate 10 is made of a lower portion 19 that includes a support substrate comprising AsGa at its interface with the underlying buffer layer, a metamorphic buffer layer comprising InGaAs at its interface with the thin layer 18, and a thin layer 18 comprising, prior to removal, InP and/or $In_xGa_{1-x}As_yP_{1-y}$, topographically profiled into motifs.

EXAMPLE 2

The donor substrate 10 is made of a lower portion 19 that includes a support substrate made of sapphire or SiC or Si, a metamorphic buffer layer made of a metamorphic buffer layer of $Al_xGa_{1-x}N$, x varying across the thickness from 0 to 1 starting from the interface with the sapphire, an additional layer of GaN intended to confine dislocation type crystallographic defects, and a thin nitride layer 18.

Dies 80 formed in accordance with the invention and comprising Group III–V nitride entities such as GaN, AlN or InN are important in the field of microelectronics. A particular use is for fabricating light emitting devices such as lasers for applications such as reading or writing high density stored data stored on compact disks, or such as light emitting diodes for novel display technologies. The materials may also be used to fabricate high power electronic components, or components that function at high temperatures.

One way of producing the thin layer 18 is through epitaxial growth on the additional GaN layer by depositing organic metals from Group I materials such as trimethyl gallium, trimethylamine alane, or trimethyl indium for respective deposits of layers of GaN, AlN and InN.

EXAMPLE 3

The donor substrate is made of a substrate 1 that includes a support substrate made of sapphire or SiC or Si, an intermediate GaN layer, an $SiO_2$ mask, a GaN buffer layer, and a thin GaN layer 18.

The mode for producing the buffer layer consists of growing nitride layers anisotropically, in particular GaN, using the technique termed ELOG. The $SiO_2$ mask used in this configuration is advantageously in the form of strips deposited in a periodic manner on the intermediate GaN layer, wherein the strips are substantially parallel to each other. The thickness of each strip is typically on the order of several tens of microns, and has a width on the order of a few micrometers. The distance separating the strips is typically about 10 μm or 15 μm. As an example, it would be possible to have an array of strips that are 13 μm apart, each strip being 0.2 μm thick and 5 μm wide.

In the GaN layer or layers deposited laterally thereon, the $SiO_2$ strips cause dislocations located near the free surface of the strips. The thickness of the GaN layer in which the dislocations are located around the mask then constitutes the buffer layer. The thin layer 18 of GaN is formed by vertical deposition on the buffer layer. Further details regarding the production of a wafer using the ELOG method can be found in the document taken from the "MRS Bulletin" dated May, 1998, volume 23, no. 5, in the article by Shuji Nakamura entitled "In/GaN/AlGaN-based laser diodes with an estimated lifetime of longer than 10000 hours".

The present invention is clearly not limited to using the materials cited above, but is also applicable to all crystalline materials from which the methods of the invention can be implemented. The array of motifs may include one or more motifs, it can be ordered or disordered, or it can be made of motifs having identical or different shapes. It should also be understood that, from the moment that the method according to the invention is implemented, an entity can be detached from the receiver surface by controlling the energy differentials between the bonding energies and the weak bond energies.

What is claimed is:

1. A wafer, comprising:
    a first substrate including a plurality of spaced projecting motifs; and
    a second substrate bonded to the plurality of spaced projecting motifs, wherein the second substrate further comprises a zone of weakness that defines a thin layer, and wherein the thin layer is detachable in the locations of the motifs to form chips on the spaced motifs suitable for use in electronics, optics, or optoelectronics applications.

2. The wafer of claim 1, wherein the first or second substrate, or both, are made of semiconductor material and the chips are suitable for use as semiconductor lasers or optical receivers.

3. The wafer of claim 1, wherein the first or second substrate, or both, are made of a semiconductor material.

4. The wafer of claim 3, wherein the semiconductor material of first or second substrate, or both, is a Group III–V alloy.

5. The wafer of claim 1, wherein the at least one motif is made of a Group III–V alloy and is in the shape of a rectangular-shaped projection having a flat free surface.

6. The wafer of claim 1, wherein the motifs have different shapes and sizes, and are regularly aligned or irregularly ordered.

7. The wafer of claim 1, which further comprises a bonding layer between the first and second substrates.

8. The wafer of claim 7, wherein the bonding layer comprises an adhesive, $SiO_2$, $Si_3N_4$ or $SiO_xN_y$.

9. A method for producing the wafer of claim 1, which comprises:
    providing a first substrate that includes at least one motif on its surface;
    providing a second substrate having a zone of weakness at a predetermined depth to define a thin layer, the second substrate including a bonding interface; and
    bonding the first and second substrates together at the bonding interface.

10. The method of claim 9, wherein bonding forces at the zone of weakness are substantially lower than adhesion forces between the at least one motif and the first substrate.

11. The method of claim 9, which further comprises supplying energy substantially homogeneously over the entire structure that includes the first and second substrates.

12. The method claim 9, further comprising, prior to supplying energy, further weakening the zone of weakness within the donor substrate by implanting atomic species into the second substrate at a depth close to the depth of the zone of weakness and applying a heat treatment.

13. The method of claim 9, wherein the second substrate is prepared by forming a porous layer on a support wafer and epitaxially growing an upper thin layer on the porous layer, wherein the porous layer forms the zone of weakness.

14. The method of claim 9, wherein the second substrate is provided by roughening at least one bonding surface of two wafers, bonding those two wafers together at the roughened bonding surface, and reducing one of those two wafers to form an upper thin layer that is bonded to the other wafer at the roughened bonding surface, wherein the roughened bonding surface forms the zone of weakness.

15. The method of claim 9, which further comprises, prior to supplying energy, forming a topographical profile of a plurality of motifs on the surface of the first substrate.

16. The method of claim 9, which further comprises, after supplying energy, customizing at least one entity on the surface of the first substrate.

17. The method of claim 16, wherein customizing comprises making an optical connection between at least two entities.

18. The method of claim 9, wherein the the first or second substrate is made of a Group III–V alloy.

19. The method of claim 9, wherein the at least one motif is made of a Group III–V alloy.

* * * * *